(12) United States Patent
Sternberg et al.

(10) Patent No.: US 10,436,855 B2
(45) Date of Patent: Oct. 8, 2019

(54) METHODS AND SYSTEMS FOR CLASSIFYING OPTICALLY DETECTED POWER QUALITY DISTURBANCES

(71) Applicant: SPAWAR Systems Center Pacific, San Diego, CA (US)

(72) Inventors: Oren Sternberg, San Diego, CA (US); John D. Rockway, San Diego, CA (US); Jeffery C. Allen, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 176 days.

(21) Appl. No.: 15/674,193

(22) Filed: Aug. 10, 2017

(65) Prior Publication Data

US 2019/0049525 A1  Feb. 14, 2019

(51) Int. Cl.
*G01R 31/40* (2014.01)
*G06K 9/00* (2006.01)
*G06K 9/46* (2006.01)
*G06K 9/62* (2006.01)
*G06N 3/08* (2006.01)

(52) U.S. Cl.
CPC ......... *G01R 31/40* (2013.01); *G06K 9/00718* (2013.01); *G06K 9/4661* (2013.01); *G06K 9/6202* (2013.01); *G06K 9/627* (2013.01); *G06K 9/628* (2013.01); *G06N 3/08* (2013.01); *G06K 2009/00738* (2013.01)

(58) Field of Classification Search
None
See application file for complete search history.

(56) References Cited

U.S. PATENT DOCUMENTS

| 8,488,123 | B1 | 7/2013 | Clark | |
|---|---|---|---|---|
| 2014/0032138 | A1* | 1/2014 | Shrestha | G01R 31/40 702/58 |
| 2017/0324236 | A1* | 11/2017 | Tomita | H02S 50/00 |

OTHER PUBLICATIONS

Shareef et al., "An image processing based method for power quality event identification," Electrical Power and Energy Systems 46 (2013) 184-197 (Year: 2013).*

(Continued)

*Primary Examiner* — Soo Shin
(74) *Attorney, Agent, or Firm* — Naval Information Warfare Center Pacific; Kyle Eppele

(57) ABSTRACT

An optically detected power quality disturbance caused by a remote load is classified as belonging to a class of known classes of power quality disturbances. Features associated with different power quality disturbances that belong to a plurality of different known classes of power quality disturbances are learned. Cross-covariance is applied to the optically detected power quality disturbance and the different power quality disturbances that belong to the different known classes of power quality disturbances to recognize features of the optically detected power quality disturbance that at least partially match the learned features. The class of power quality disturbances among the plurality of classes of different known power quality disturbances to which the optically detected power quality disturbance belongs is determined based on the recognized features.

19 Claims, 12 Drawing Sheets

(56) References Cited

OTHER PUBLICATIONS

Yin et al., "Remote Power Quality Monitoring and Analysis System Using LabVIEW Software," International Instrumentation and Measurement Technology Conference Singapore, May 5-7, 2009 (Year: 2009).*

Sternberg, O., @ Home Experiments, Power Point Presentation, Sep. 2012.

Lee et al., Optimal Feature Selection for Power-Quality Disturbances Classification, IEEE Transactions on Power Delivery, vol. 26, No. 4, Oct. 2011.

Uyar et al., An expert system based on S-transform and neural network for automatic classification of power quality disturbances, Expert Syst. Appl. vol. 36, No. 3, pp. 5962-5975, Apr. 2009.

Mendes et al., The fuly informed particle swarm: Simpler, maybe better, IEEE Trans. Evol. Comput., vol. 8, No. 3, pp. 204-210, Jun. 2004.

Kennedy et al., Neighborhood topologies in fully informed and best-of-neighborhood partical swarms, IEEE Trans. Syst., Man, Cybern. C, Appl. Rev., vol. 36, No. 4, pp. 515-519, Jul. 2006.

Jordan et al., Social interaction in particle swarm optimization, the ranked FIPS and adaptive multi-swarms, in Proc. Genetic Evol. Comput. Conf., pp. 49-56, 2008.

Specht et al., Experience with adaptive probabilistic, neural netowrks and adaptive general regression neural networks, in Proc. IEEE Int. Conf. Neural Netw., vol. 2, pp. 1203-1208, 1994.

Sternberg et al., Optical remote sensing and correlation of office equipment functional state and stress levels via power quality disturbances inefficiencies, in Proc. SPIE 9971, Applications of Digital Image Processing (Sep. 27, 2016).

Sternberg et al., Optical remote sensing and correlation of office equipment functional state and stress levels via power quality disturbances inefficiencies, Power Point presentation, SPIE Optical Engineering + Applications, Aug. 31, 2016.

IEEE Standards Association. "1159-2009. IEEE Recommended Practice for Monitoring Electric Power Quality Industrial and Commercial Applications." (2009).

Janik et al. Automated classification of power-quality disturbances using SVM and RBF networks, IEEE Transactions on Power Delivery, 21(3), 1663-1669, 2006.

Abdel-Galil et al, Power quality disturbance classification using the inductive inference approach. IEEE Transactions on Power Delivery, 19(4), 1812-1818, 2004.

Manimala et al., Hybrid soft computing techniques for feature selection and parameter optimization in power quality data mining, Applied Soft Computing, 11(8), pp. 5485-5497, 2011.

Youssef et al., Disturbance classification utilizing dynamic time warping classifier, IEEE Transactions on Power Delivery, 19(1), pp. 272-278 (2004).

Khokhar et al., MATLAB/Simulink based modeling and simulation of power quality disturbance, in 2014 IEE Conference on Energy Conversion (CENCON), pp. 445-450, Oct. 2014.

May et al, , An investigation of the response of incandescent lamps and compact fluorescent lamps to voltage fluctuations, in 2010 14th IEEE International Conference on Harmonics and Quality of Power (ICHQP), pp. 1-8, Sep. 2010.

May et al., An investigation of the response of incandescent lamps and compact fluorescent lamps to voltage fluctuations, All Theses, Paper 961, Sep. 2010.

Gunther et al., Interharmonics-recommended updates to IEEE 519. In 2002 IEEE Power Engineering Society Summer Meeting, vol. 2, pp. 950-954, Jul. 2002.

Moody, J., Prediction risk and architecture selection for neural networks, in From Statistics to Neural Networks, pp. 147-165, Springer Berlin Heidelberg, 1994.

* cited by examiner

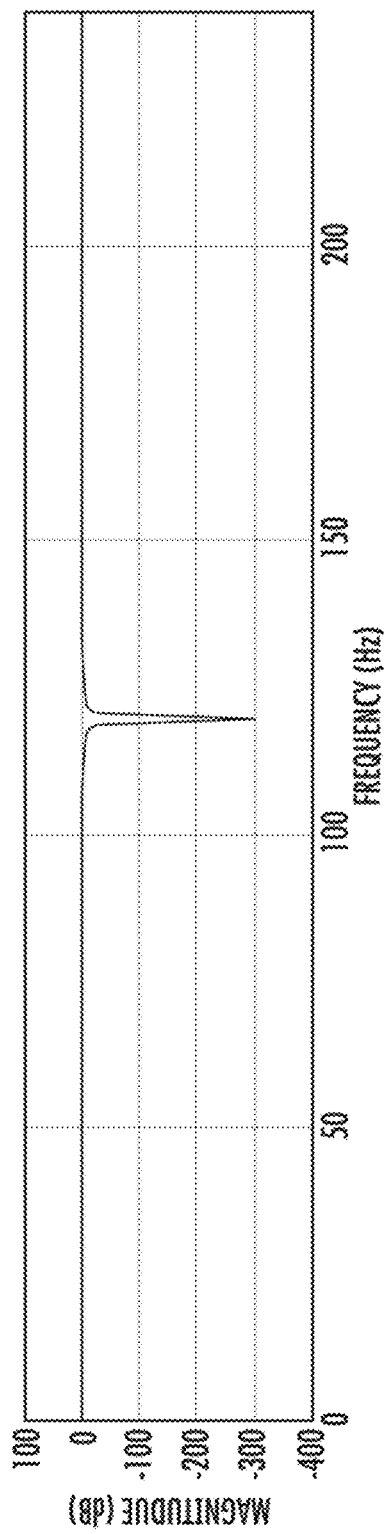
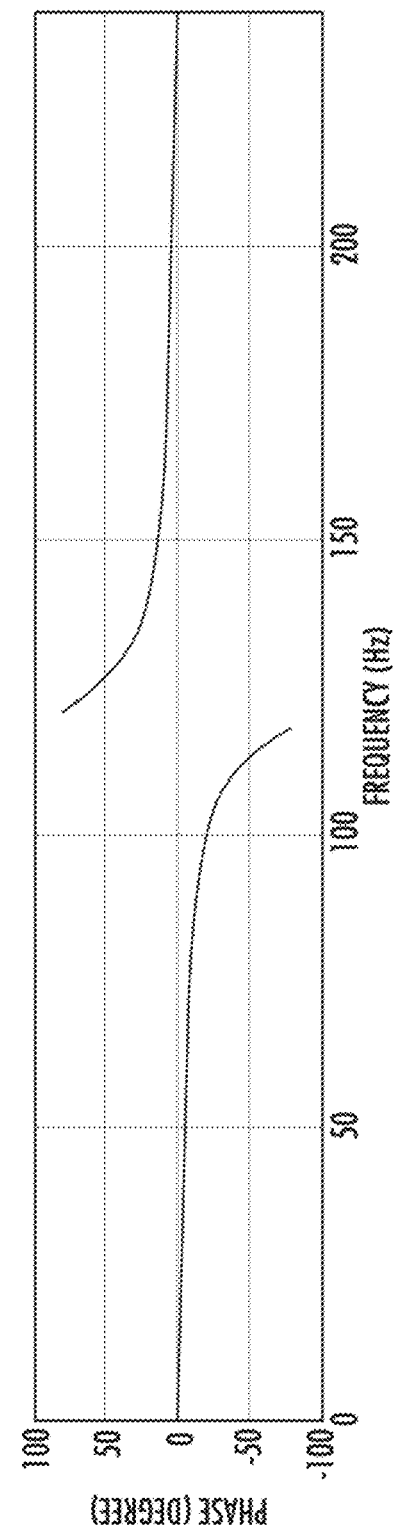
FIG. 5A
FIG. 5B

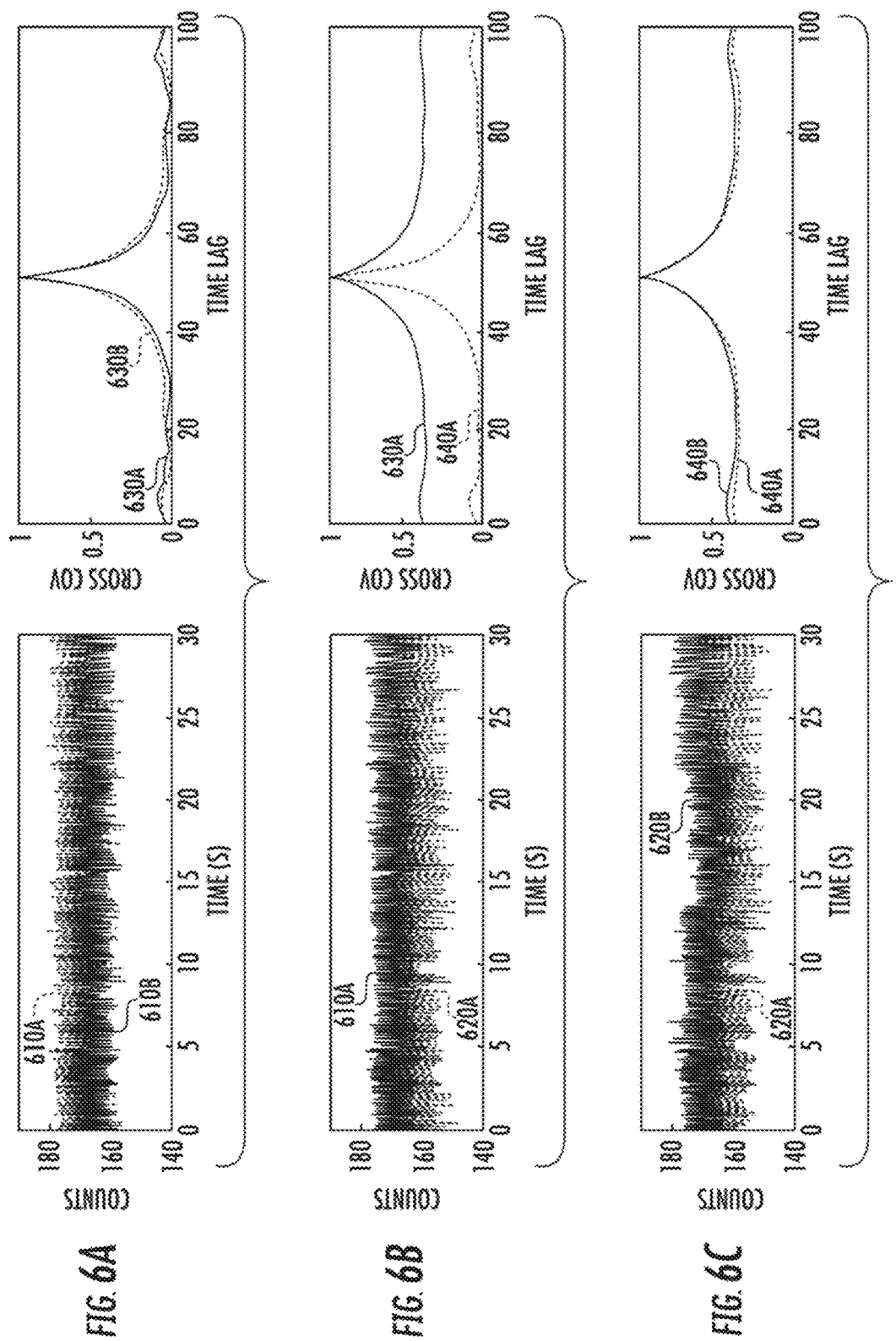

METHODS AND SYSTEMS FOR CLASSIFYING OPTICALLY DETECTED POWER QUALITY DISTURBANCES

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc pac t2@navy.mil, referencing NC 103251.

FIELD OF THE INVENTION

The present invention pertains generally to classifying power quality disturbances. More particularly, the present invention pertains to classifying optically detected power quality disturbances.

BACKGROUND OF THE INVENTION

Transients are electrical manifestations of sudden changes in circuit conditions (switching, faults, etc.). While the science of transients has roots in the late 1800's, modern research efforts and applications focus on power quality disturbances on electrical power grids using invasive electronic techniques.

Improvements have been made in detecting power quality disturbances. However, the hardware associated with detecting power quality disturbances is invasive, requiring the insertion of devices into existing and new infrastructure. Algorithms and techniques to analyse and address power quality disturbances, such as probabilistic neural networks and fully-informed particle swarms, have been used in industry and academia to interface with radio frequency (RF) equipment and electronics to correlate with existing power grid infrastructures.

Passive, remote-sensing, optical cameras have been recently shown to extract vibration signatures using optical modulation techniques. However, no such systems exist to remotely detect power quality disturbances. In addition, such systems have not been able to classify the information captured by optical cameras.

In view of the above, it would be desirable to have a remote optical sensing system for detecting power quality disturbances. It would further be desirable to have such a system be able to classify the detected power quality disturbances.

SUMMARY OF THE INVENTION

According to an illustrative embodiment, an optically detected power quality disturbance caused by a remote load is classified as belonging to a known class of power quality disturbances. Features associated with different power quality disturbances that belong to a plurality of different known classes of power quality disturbances are learned. Cross-covariance is applied to the optically detected power quality disturbance and the different power quality disturbances that belong to the different known classes of power quality disturbances to recognize features of the optically detected power quality disturbance that at least partially match the learned features. The class of power quality disturbances among the plurality of classes of different known power quality disturbances to which the optically detected power quality disturbance belongs is determined based on the recognized features.

These, as well as other objects, features and benefits will now become clear from a review of the following detailed description, the illustrative embodiments, and the accompanying drawings.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which:

FIGS. 5A and 5B illustrate an example of application of a humming filter to suppress a baseline signal of a power grid according to an illustrative embodiment.

FIGS. 6A-6C illustrates examples of application of cross-covariance to intensity responses of power quality disturbances caused by a household device according to an illustrative embodiment.

DETAILED DESCRIPTION OF THE EMBODIMENTS

With an optical source connected to the same local power grid as a load causing a power quality disturbance, the voltage variation in amplitude and frequency response caused by the power quality disturbance will change the response of the optical source. This change in the response of the optical source can visually be observed as, for example, a light connected to the same local power grid as a household device flickering when the household device is used. According to illustrative embodiments, the change in the optical source response can be recorded and analyzed to classify the power quality disturbance. Machine learning can be used to aid in the classification of optically detected power quality disturbances.

Figure 1:
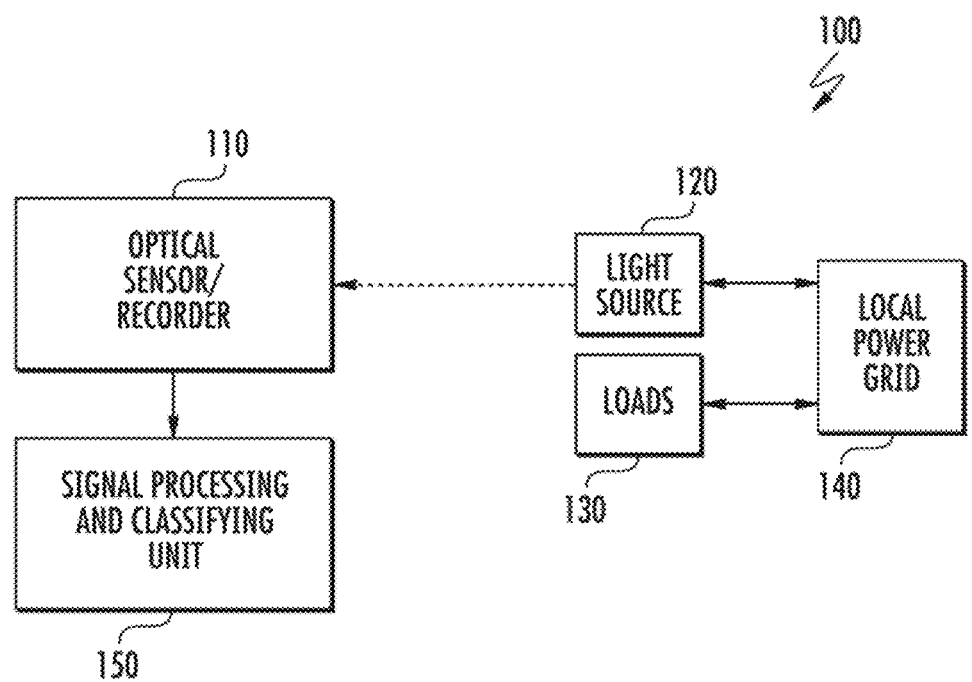
FIG. 1 illustrates a system for optically detecting power disturbances and classifying the same according to illustrative embodiments.

This may be understood with reference to FIG. 1 which illustrates a system 100 for optically detecting power disturbances and classifying the same according to illustrative embodiments. Referring to FIG. 1, the system includes an optical sensor/recorder 110, such as a high frame rate camera. The camera is remote from but is able to record video of a light source 120. The light source 120, in turn, is connected to a local power grid 140. Loads 130 are also connected to the local power grid. Operation of the loads 130 causes different power quality disturbances (depending on the loads and the mode of operation of the loads).

One or more power quality disturbances caused by one or more loads 130 cause changes in the optical response of the light source 120. The optical sensor/recorder 110 records the optical response of the light source over time, including the changes in the optical response caused by the power quality disturbance(s). In this manner, the sensor/recorder 110 optically detects the power quality disturbance(s) caused by the loads 130. This recorded optical response may then be analyzed by a signal processing and classifying unit 150 that is connected to the sensor/recorder 110 (via a wire or wirelessly) to extract data from the optical response that may be used to classify the optically detected power quality disturbance(s). The signal processing and classifying unit 150 may include one or neural networks and/or computing devices, such as the computing device shown in FIG. 8 and described below. The signal processing and classifying unit 150 may also include or be connected to a display monitor (not shown in the interest of simplicity of illustration).

The power quality disturbances that may be optically detected and classified as described herein include, for example, sags, swells, interruptions, flickering, oscillatory transients, harmonics, notches, spikes, combinations thereof, etc. Each power quality disturbance causes a different response from the light source 120 which is optically detected by the sensor/recorder 110. From the optically detected power quality disturbance, an intensity response and/or a frequency response may be extracted by the signal processing and classifying unit 150. The intensity responses and frequency responses of optically detected quality disturbances have different features which may be learned for use in classifying types of power disturbances.

Figure 2A:
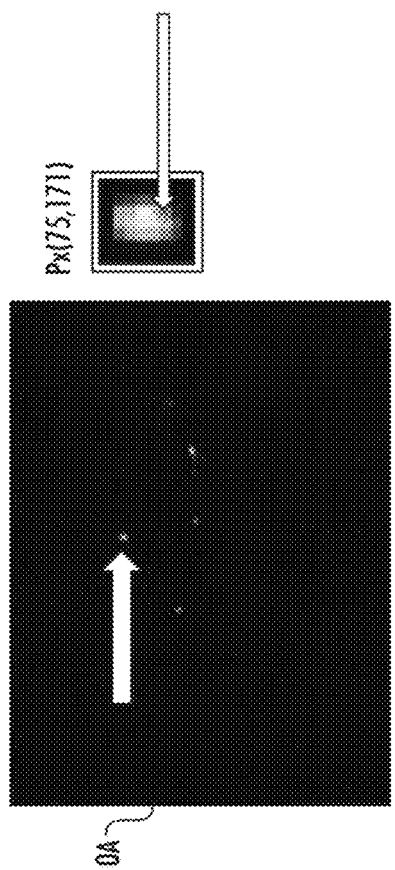
FIG. 2A illustrates an example of video recording of a light source according to an illustrative embodiment.

Referring now to the details of optical detection of a power quality disturbance, FIG. 2A illustrates an example of video recording of a light source connected to the same power grid as a load according to an illustrative embodiment. As shown in FIG. 2A, a video frame 210A recorded, for example, by the sensor/recorder 110, includes a recorded image of traffic lights connected to the same power grid as loads in the area of the traffic lights. Each pixel in the recorded video frame 210A has values of red, green and blue (RGB) channels that vary over time. To optically detect a power quality disturbance that affects the output of a light source, a pixel is chosen in a recorded image of the light source that is not totally saturated with light but is close enough to the light source to have values of red, green, and blue that provide information regarding the power quality disturbance that affects the optical response of the light source. That is, a pixel is chosen that has a high enough value in at least one of the red, green, or blue channels to provide information about the power quality disturbance.

As shown in FIG. 2A, an extracted recorded image of a pixel at a position having x,y coordinates of 75 and 171, respectively, within the recorded video frame 210A is shown. This pixel is chosen for analysis because it has a high intensity and provides information that is indicative of a power quality disturbance.

Figure 2B:
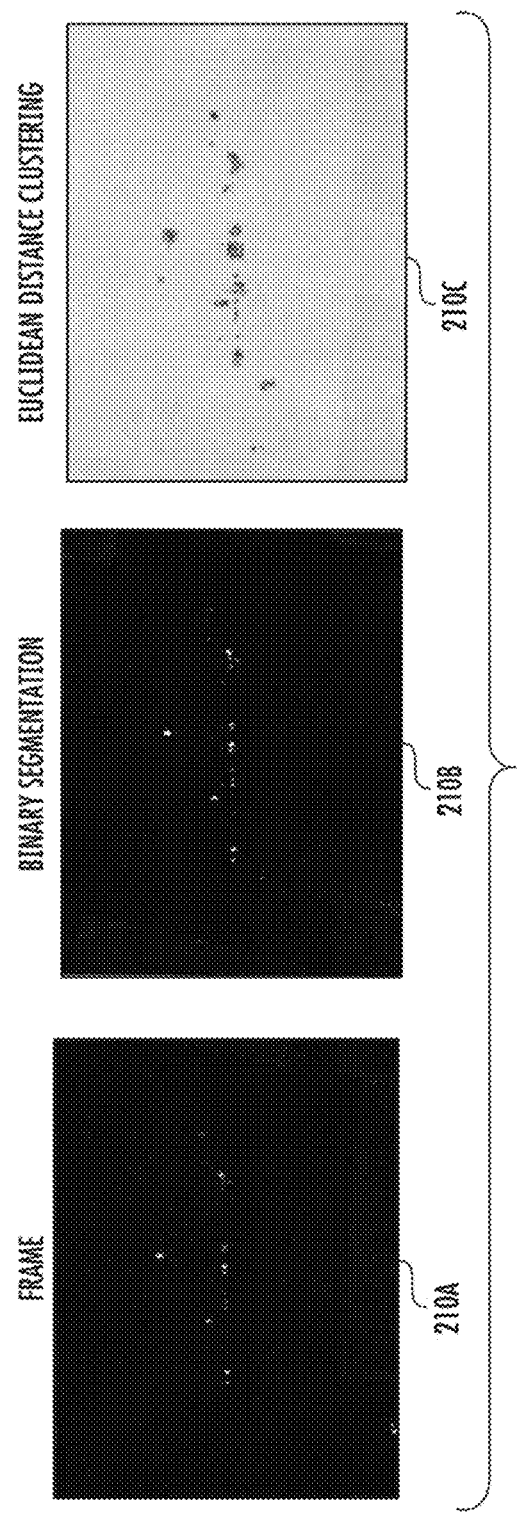
FIG. 2B illustrates examples of signal processing techniques for pixel isolation according to an illustrative embodiment.

Referring to FIG. 2B, the pixel may be isolated using various techniques. For example, a segmentation technique, such as binary segmentation, may be applied to segment the recorded video frames (represented as a frame 210A in FIG. 2B), such that only portions of the video that include information indicative of a power quality disturbance over time are selected. The segmented portion of the video recording is represented in FIG. 2B as segmented frame 210B. Then, a clustering technique, such as Euclidean distance clustering, may be applied to isolate the data within the segmented frame that is indicative of the power quality disturbance. Application of the clustering to the data within the segmented frame is represented in FIG. 2B as clustered data 210C. Pixel isolation, including segmenting and clustering, may be performed by the signal processing and classifying unit 150.

As those skilled in the art will appreciate, to be useful for computer analysis, the value of the pixel is converted into an integer number in the range 0 to 255, the range that a single 8-bit byte can offer. This integer number may also be referred to as counts. The maximum count of a pixel of any of the RGB channels is 255, while the minimum count is 1. If a pixel is totally saturated with light, the count of the pixel (referred to as Tmax) will be 255. This conversion may be performed by the signal processing and classifying unit 150.

Figure 2C:
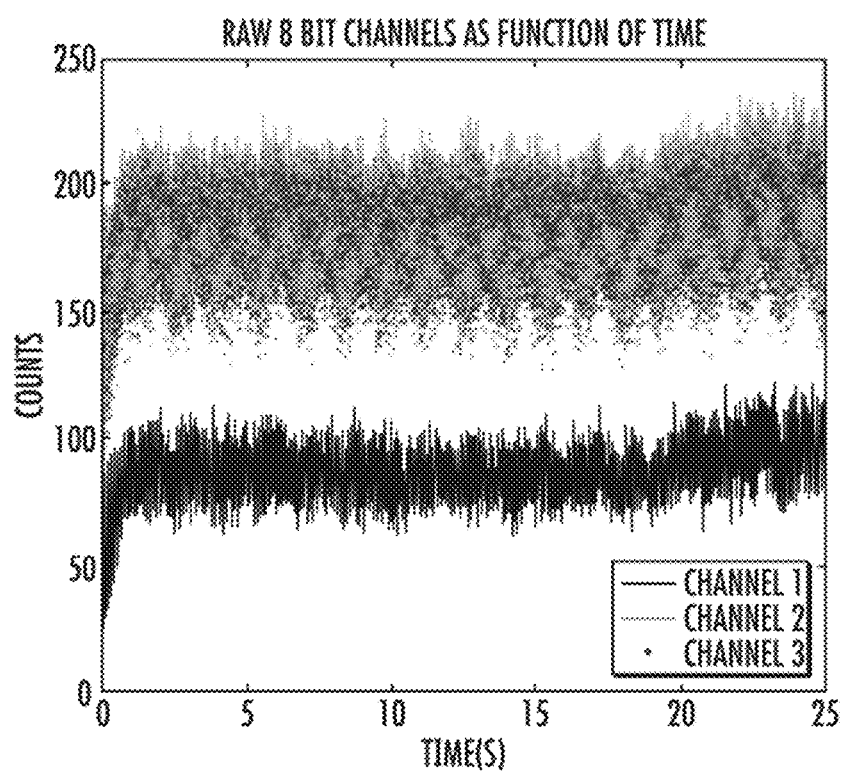
FIG. 2C illustrates an example of an extracted intensity response of a power quality disturbance according to an illustrative embodiment.

Having converted the value of the pixel into counts, the fluctuation of the counts of the pixel over time may be expressed as an intensity response. An example of an intensity response, which may be determined by the signal processing and classifying unit 150, is shown in FIG. 2C. In FIG. 2C, the intensity responses for the red, green and blue channels are identified as Channel 1, Channel 2, and Channel 3, respectively. As can be seen in FIG. 2C, the intensity responses fluctuate over time. Different classes of power quality disturbances are associated with different intensity responses. Thus, based on the intensity response of one or more channels of an optically detected power quality disturbance, the power quality disturbance may be classified. This is described in more detail below.

Figure 2D:
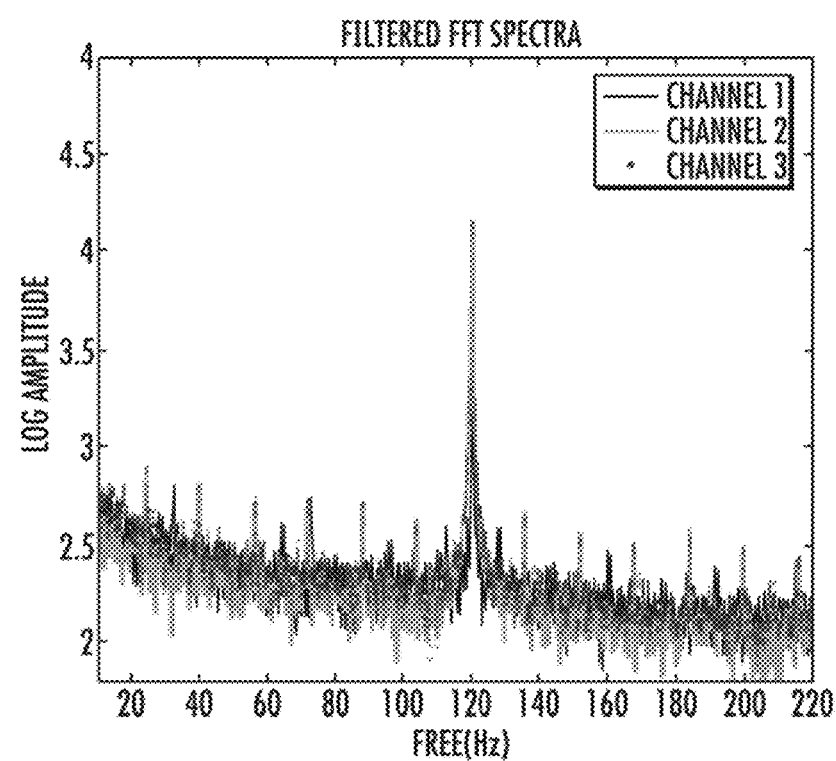
FIG. 2D illustrates an example of an extracted frequency response of a power quality disturbance according to an illustrative embodiment.

Applying a Fast Fourier transform to an intensity response, such as that shown in FIG. 2C, produces a frequency response, such as that shown in FIG. 2D. In FIG. 2D, the intensity responses for the red, green and blue channels are identified as Channel 1, Channel 2, and Channel 3, respectively. The Fast Fourier transform may be applied by the signal processing and classifying unit 150. The frequency response may be understood as a variation in amplitude at different frequencies. Light oscillates at twice the baseline frequency of the power grid, i.e., 2×60 Hz=120 Hz. Thus, as can be seen from FIG. 2D, there is a peak in the frequency responses at 120 Hz. The frequency responses shown in FIG. 2D represent the optical output of a light source not affected by quality disturbances for simplicity of illustration. If there were a power quality disturbance, there would be peaks in the frequency responses at different frequencies. Different classes of power quality disturbances are associated with different frequency responses. Thus, based on the frequency responses of one or more channels of an optically detected power quality disturbance, the power quality disturbance may be classified. This is described in more detail below.

Figure 3:
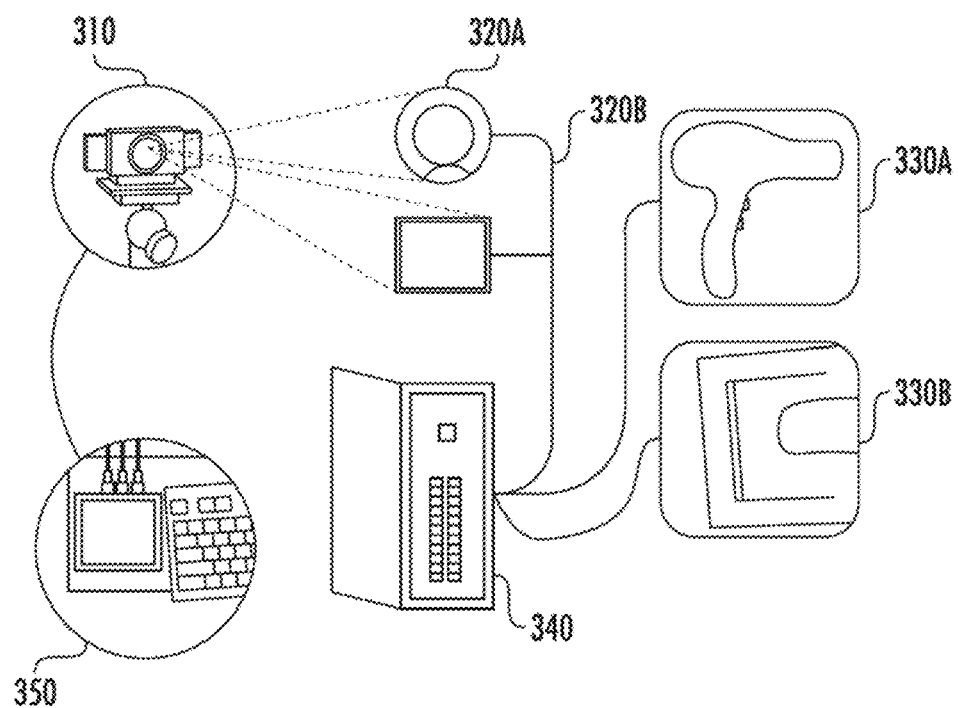
FIG. 3 illustrates in detail an example of a system for optically detecting power quality disturbances and classifying the same according to illustrative embodiments.

To illustrate the relationship between power quality disturbances caused by loads and the observable optical responses of light sources connected to the same power grids as the loads, experiments were conducted using a system shown in FIG. 3. The results of the experiments are described below with reference to FIGS. 4A-4C and FIG. 6A-6C.

Referring to FIG. 3, the system used in the experiment included camera(s) 310 mounted on a tripod recording video at frame rates ranging from ~30 frames per seconds (FPS) to ~480 FPS. Each of the camera(s) 310 was connected to a computer 350 including a monitor display. Each camera 310 was pointed directly at a light source 320A or a reflective surface 320B. The light source 320A was plugged into the local switch breaker box 340, along with household electronic equipment including a hair dryer 330A and a printer 330B (also referred to in this experiment as objects). The powered electronic devices that include hair dryer 330A and printer 330B were then operated by a user applying or changing various operational modes. Table 1 provides a list of the specific hardware used for this experiment.

TABLE 1

| Device | Models | Function | Comments |
|---|---|---|---|
| Light Bulb | (GE) 75 W, (DD) 25 W | Source | Direct light source |
| Digital Camera | Fujifilm FinePix F770EXR, F900 EXR | Camera | 480 FPS 320 FPS |
| Universal Serial Bus (USB) Camera | Logitech HD Pro Webcam C920 | Camera | 29.94 FPS |
| Printer: | BROTHER 1440 | Object | Pages, 1, 3, 5, 10, 15 |
| Hair Dryer | Infiniti PRO Conair | Object | Modes: High/Low |
| Granite Table | Level 4 | Object | Reflection (Indirect light source) |
| Monitor | Level 4 | Control/Processing | |
| MacBook/NUC | PRO/17 | Control/Processing | |

Figure 4A:
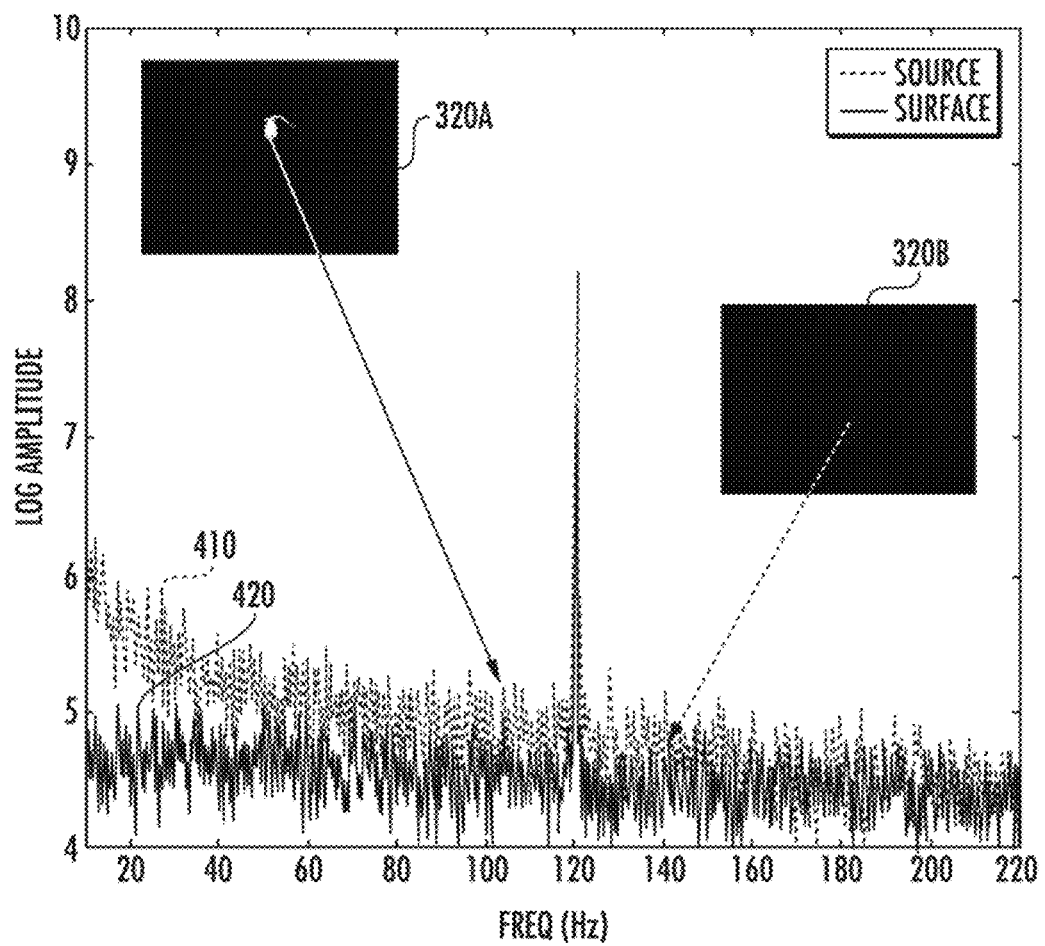
FIG. 4A illustrates an example of extracted frequency responses of a power quality disturbance optically detected using a direct light source and a reflection of a light source according to an illustrative embodiment.

The experiment was conducted to observe the baseline frequency of the power grid based on the optical response of the light source 320A and the reflective surface 320B. Using the setup shown in FIG. 3, a few seconds of video were recorded at 380 FPS, with the camera 310 pointed directly at the light source 320A in the first video and pointed at the reflective surface 320B in the second video. The intensity response in the time domain and the frequency response in the frequency domain were extracted from the recorded video in the manner described above with reference to FIGS. 2B and 2C using signal and image processing algorithms in programming tools optimized for solving mathematical problems. The extracted frequency responses were plotted as a function of amplitude as shown in FIG. 4A. In FIG. 4A, the line 410 represents the frequency response of the video of the light source 320A, and the line 420 represents the frequency response of the video of the reflective surface (indirect light source) 320B. As can be seen from FIG. 4A, the expected ~120 Hz peak is present in both the frequency response. As expected, the intensity of the frequency response 420 extracted from the video of the reflective surface 320B is lower than the intensity of the frequency response 410 extracted from the video of the direct light source 320A.

Figure 4B:
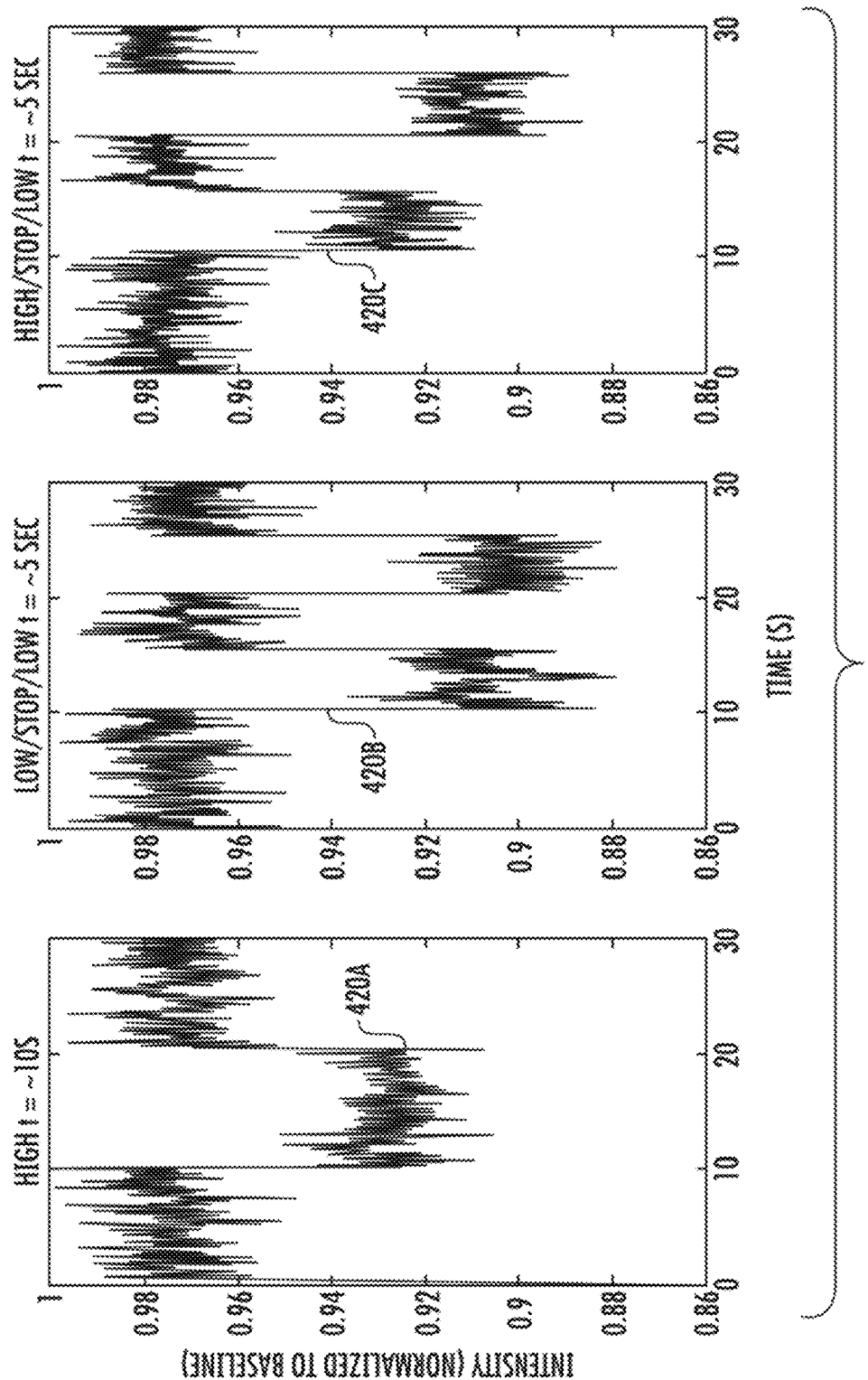
FIG. 4B illustrates examples of intensity responses of optically detected power quality disturbances caused by different modes of operation of a hairdryer according to an illustrative embodiment.

Referring now to FIGS. 3 and 4B together, the optically detected power quality disturbance response in the time domain, referred to as the intensity response, was explored using a hair dryer 330A with two operational modes (low and high). Using a 75 Watt light source 320A plugged into the same local switch breaker box 340 as the hairdryer 330A, a swell-like intensity response was observed that varied between the low and high operational modes.

As can be seen from FIG. 4B, a change in operation of the hair dryer from a stop mode to a high mode to the stop mode caused a power quality disturbance that produced an intensity response 420A. Operation of the hair dryer 330B from the stop mode to the low mode, to the stop mode, to the low mode, then back to the stop mode caused a power quality disturbance that produced an intensity response 420B. Operation of the hair dryer from the stop mode to the high mode, to the stop mode, to the low mode, then back the stop mode seconds caused a power quality disturbance that produced an intensity response 420C. It is evident from FIG. 4B that different modes of operation of the hair dryer cause power quality disturbances that are associated with different intensity responses. Thus, based on the intensity response, the power quality disturbance caused by the mode of operation of the hair dryer may be discerned.

Figure 4C:
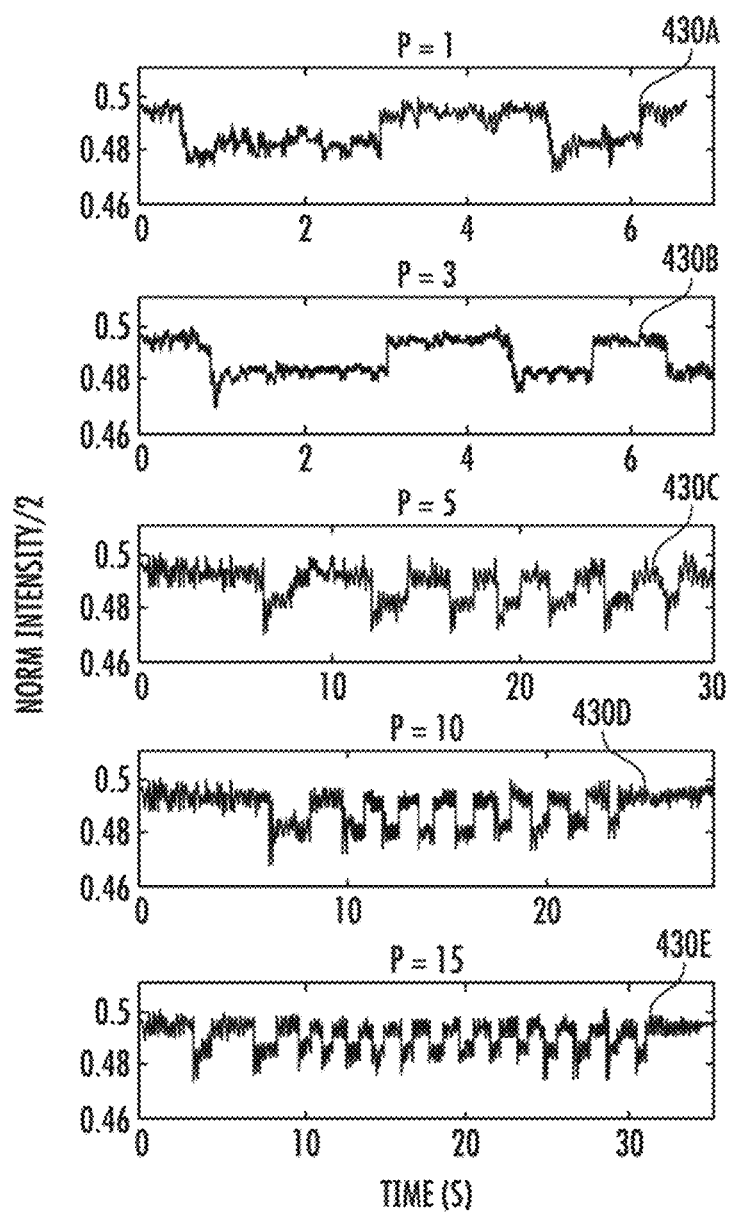
FIG. 4C illustrates examples of intensity responses of optically detected power disturbances caused by a printer printing different numbers of pages according to an illustrative embodiment.

Referring now to FIGS. 3 and 4C together, the intensity responses produced by the power quality disturbances caused by a printer 330B printing different number of pages over a limited time was explored. Printing of one page over approximately eight seconds results in a power quality disturbance that produced an intensity response 430A. Printing of three pages over approximately the same amount of time resulted in a power quality disturbance that produced an intensity response 430A. Printing of five pages, ten pages, and fifteen pages over approximately thirty seconds resulted in power quality disturbances that produced intensity responses 430C, 430D, and 430E, respectively. FIG. 4C demonstrates that there is a correlation between the numbers of pages printed and the intensity responses associated with the power quality disturbances caused by printing the numbers of pages. Thus, based on the intensity response, the utilization of the printer, in terms of the number of pages printed, may be deduced.

Figure 4D:
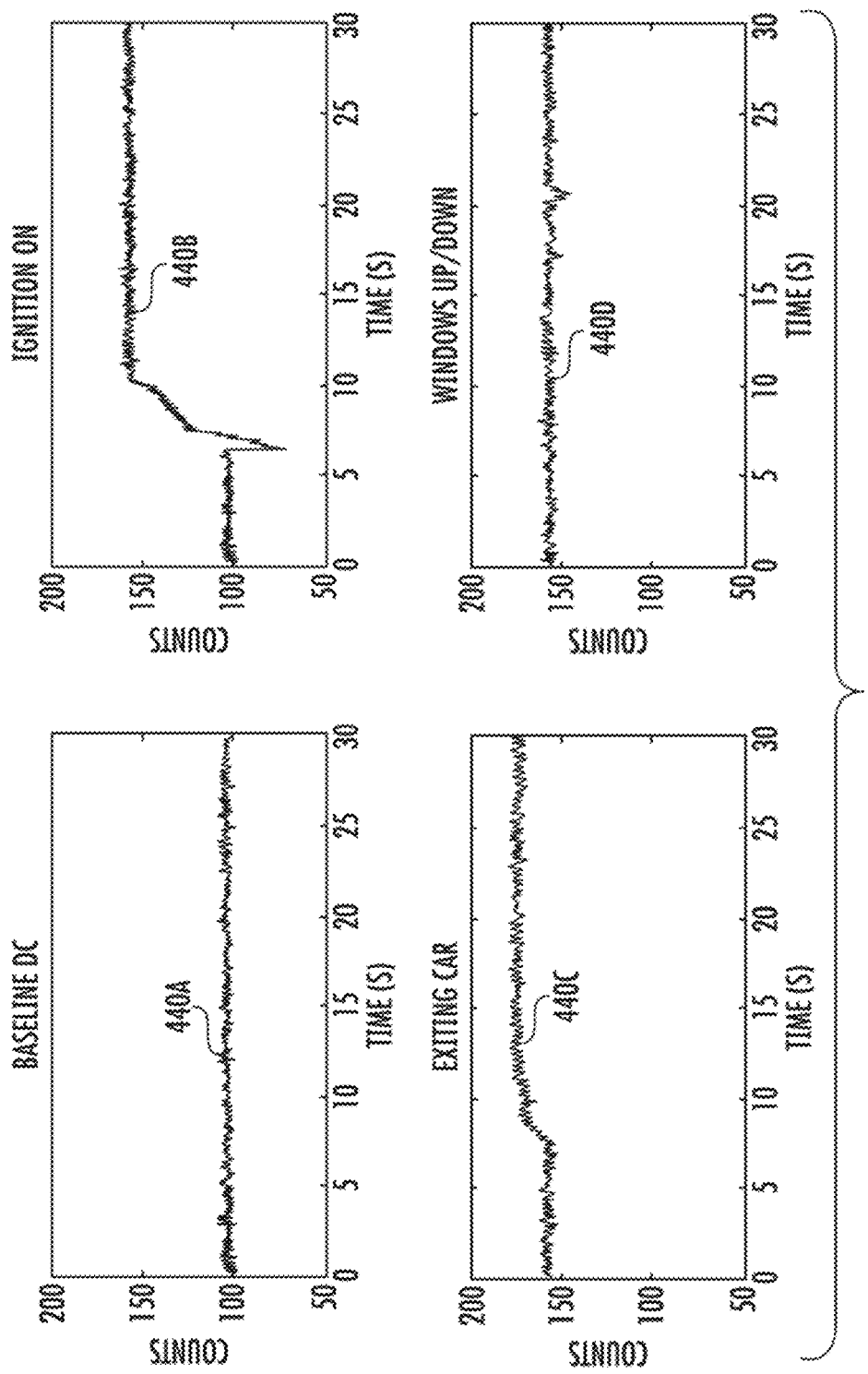
FIG. 4D illustrates examples of intensity responses of detected power disturbances caused by different modes of operation of an automobile according to an illustrative embodiment.

An experiment was also conducted to detect power quality disturbances caused by different modes of operation of an automobile. In the experiment, the light sources used were the headlights of an automobile. A camera and a computer similar to those shown in FIG. 3 were also used. The results of the experiment are shown in FIG. 4D which illustrates examples of intensity responses (shown as counts) of optically detected power quality disturbances caused by different modes of operation of the automobile. As can be seen from FIG. 4D, the baseline DC operation of the automobile, with the ignition off, results in a power quality disturbance that produces an intensity response 440A. Turning on the ignition results in a power quality disturbance that produces an intensity response 440B. A person exiting the automobile causes a power quality disturbance that produces an intensity response 440C. Moving the windows of the automobile up and down causes a power quality disturbance that produces the intensity response 440D. It can be deduced from FIG. 4D that different modes of operation of the automobile produce different power quality disturbances that, in turn, produce different intensity responses. It follows that, based on the intensity response, the power quality disturbance and the mode of operation of the automobile that produced it can be deduced. Further, as different people weighing different amounts will cause different power quality disturbances when they exit the automobile, if follows that the methodology described above may be used to discern which person is exiting the car It should be appreciated that, in addition to the hardware described above, different types of sensors, processors, loads, and light sources may be used to detect and analyze power quality disturbances caused by any number/variation of loads connected to the same power grid as the light source.

As demonstrated above, different optically detected power quality disturbances produce different intensity responses and different frequency responses. It follows that if the intensity responses and frequency responses produced by different powered quality disturbances are known, then optically detected power quality disturbances may be classified based on the intensity responses and the frequency responses they produce. Cross-covariance may be used for this purpose.

In signal processing, cross-covariance is a measure of similarity of two signals which may be used to find features in an unknown signal by comparing it to a known one. The cross-covariance provides a quantitative assessment of the similarity of two signals at all possible time shifts, also referred to as time lags.

Figure 8:
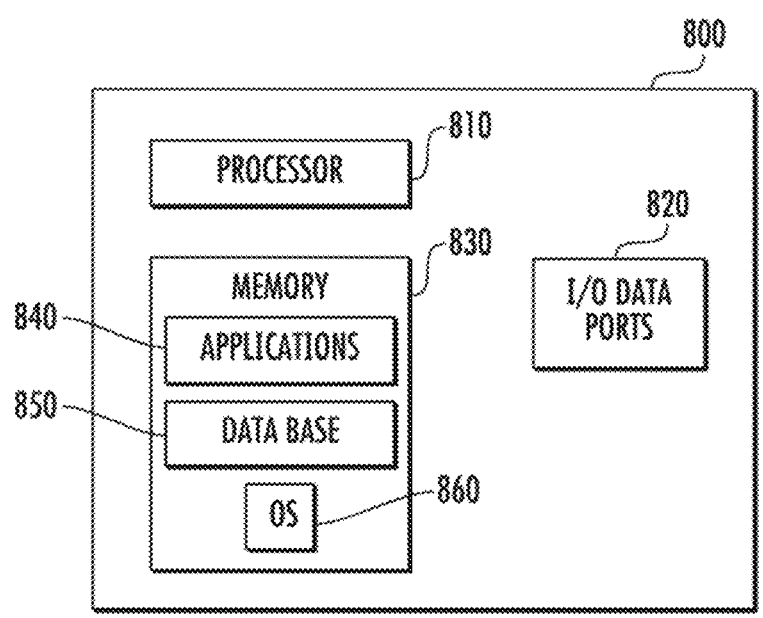
FIG. 8 illustrates an example of a computing device with which a system for classifying optically detected power quality disturbances may be implemented according to illustrative embodiments.

According to illustrative embodiments, features associated with intensity responses and frequency responses that are associated with known classes of power quality disturbances may be learned, e.g., using a neural network and/or a processor in a computing device, such as that shown in FIG. 8. Feature learning may include initially assigning weights to the neural network based on the features associated with the intensity responses, predicting classes of power quality disturbances that produce the intensity responses and frequency responses, calculating a loss function corresponding to an error between the predicted classes and the actual classes of power quality disturbances that produce the intensity responses and frequency responses, and adjusting the weights of neural network such that the loss function is minimized.

After the features of intensity responses and frequency responses produced by different power quality disturbances are learned, field vectors indicative of such features may be generated. Then, cross-covariance may be applied such that features of an unknown power quality disturbance that at least partially match features of a known class of power disturbances may be recognized. That is, the intensity response and/or the frequency response produced by an unknown optically detected power quality disturbance may be cross-correlated with or mapped to the intensity responses and/or the frequency responses produced by known classes of power quality disturbances to determine which of the known classes of power quality disturbances produces an intensity response and/or a frequency response that have features that at least partially match the features of the intensity response and/or the frequency response produced by the unknown optically detected power quality disturbance. Based on the recognized features, the unknown optically detected power quality disturbance may be classified as belonging to one of the known classes of power quality disturbances.

Reference is now made to drawings to explain cross-covariance of intensity responses. Before applying cross-covariance, a humming notch filter may be applied to remove the baseline signal of the power grid, i.e., the 120 Hz signal. Application of the filter may be expressed in terms of both magnitude, as illustrated in FIG. 5A, and phase, as illustrated in FIG. 5B.

Referring now to FIGS. 6A, 6B, and 6C, cross-variance may be applied to intensity responses to correlate the power quality disturbances that caused the intensity responses with known classes of power quality disturbances. For illustrative purposes, baseline intensity responses and intensity responses extracted from optically detected power quality disturbances caused by operation of one or more blenders are shown. In the experiment conducted for this purpose, two blenders were used. Intensity responses are shown on the left portions of FIGS. 6A, 6B, and 6C, while application of cross-covariance to the intensity responses is shown on the right portions.

Referring first to the left portion FIG. 6A, a first baseline intensity response 610A and a second baseline intensity response 610B are shown. As shown in the right portion of FIG. 6A, application of cross-covariance to the intensity responses produces outputs 630A and 630B that closely match.

Referring now to the left portion of FIG. 6B, the first baseline intensity response 610A and an intensity response 620A extracted from an optically detected power quality disturbance produced by a first blender are shown. As shown in the right portion of FIG. 6B, application of cross-covariance to the intensity responses produces outputs 630A and 640A that do not match.

Referring now to the left portion FIG. 6C, an intensity response 620A extracted from an optically detected power quality disturbance produced by a first blender and an intensity response 620B extracted from an optically detected power quality disturbance produced by a second blender are shown. The intensity responses 620A and 620B may correspond to operation of the first and second blenders that are of the same model in the same mode. As shown in the right portion of FIG. 6C, application of cross-covariance to the intensity responses produces outputs 640A and 640B that closely match.

As can be seen FIGS. 6A and 6C, when cross covariance is applied to intensity responses having similar features, the results closely match. On the other hand, when cross-covariance is applied to intensity responses that do not have similar features, the results do not closely match. Thus, by using cross-covariance, an intensity response extracted from an unknown optically detected power quality disturbance may be mapped to a matching intensity response associated with a known class of power quality disturbances. The unknown optically detected power quality disturbance may then be classified as belonging to the known class of power quality disturbances having the matching intensity response.

Although FIGS. 6A-6C illustrate cross-covariance applied to intensity responses, it should be appreciated that cross-covariance may be applied in a similar manner to frequency responses to classify an unknown optically detected power quality disturbance.

Figure 7:
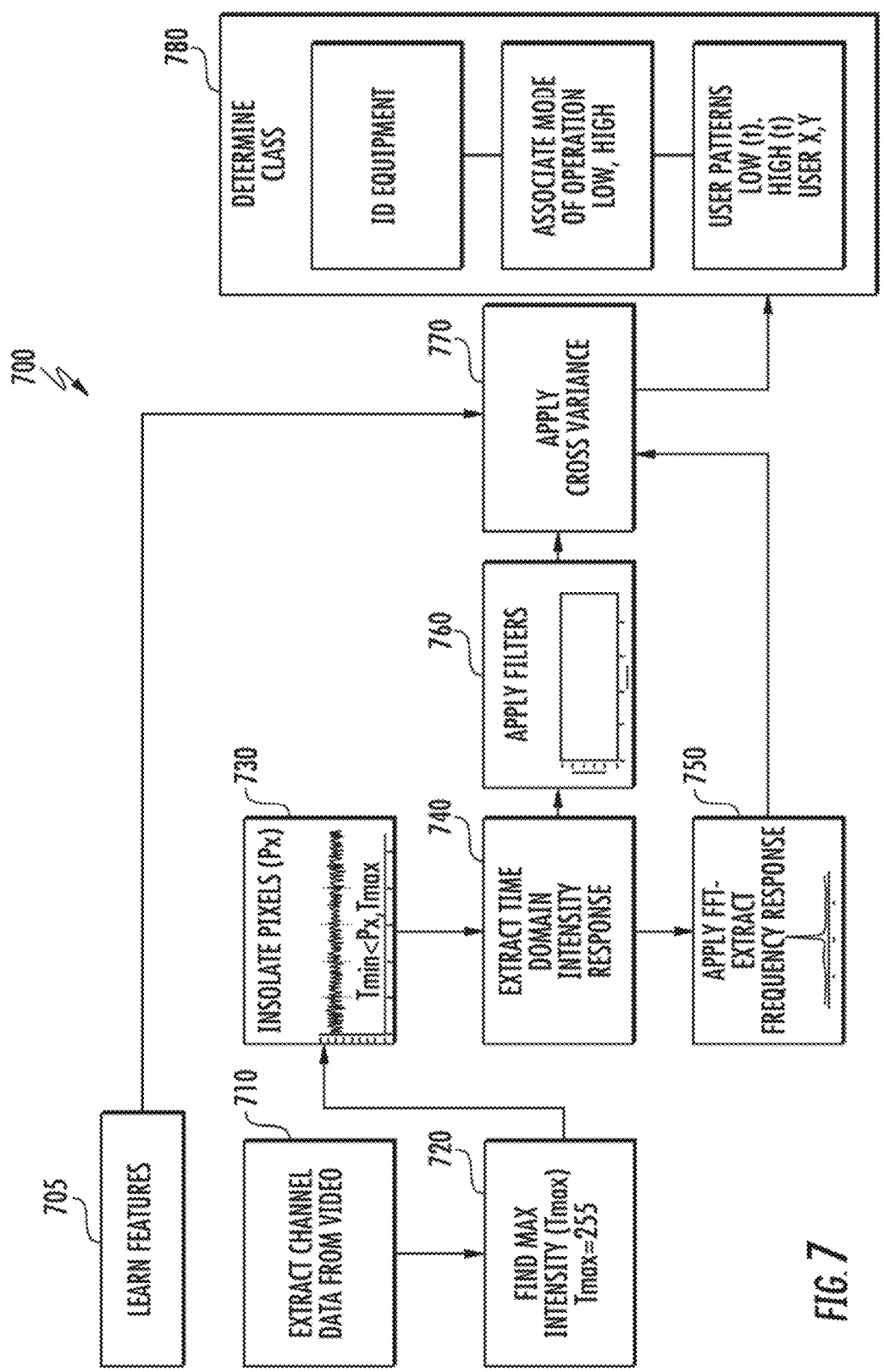
FIG. 7 is a flow chart showing steps in a process for classifying an optically detected power quality disturbance according to illustrative embodiments.

FIG. 7 is a flow chart showing steps in a process for classifying an optically detected power quality disturbance according to illustrative embodiments. It should be appreciated that the steps and order of steps described and illustrated are provided as examples. Fewer, additional, or alternative steps may also be involved in the process for optically detecting and classifying a power quality disturbance and/or some steps may occur in a different order.

Referring to FIG. 7, the process 700 begins at step 705 at which features of intensity responses and frequency responses associated with known classes of optically detected power quality disturbances are learned. This step may be performed using, for example, a neural network or a processor in a computing device, such as that shown in FIG. 8, which may include the signal processing and classifying unit 150 shown in FIG. 1. Similarly, steps 710-780 described below may be performed by a processor in the same or a different computing device, which may include the signal processing and classifying unit 150 shown in FIG. 1.

Referring again to FIG. 7, at step 710 channels of data (R, G, or B) are extracted from a recorded video of a light source connected to the same power grid as at least one load causing a power quality disturbance. At step 720, the maximum intensity of the channels is determined. At step 730, a pixel of the recorded video channels is isolated that is indicative of a power quality disturbance. Pixel isolation may include segmentation and clustering as described above with reference to FIG. 2B. At step 740, the intensity response of the power quality disturbance is determined. At step 750, the frequency response of the power quality disturbance is determined. At step 760, filters are applied to the intensity response to remove the baseline signal. At step 770, cross-covariance is applied to at least one of the intensity response and the frequency response using the features learned from step 705. At step 780, the class of the optically detected power quality disturbance is determined. The class is one among a plurality of classes of power quality disturbances known to be associated with a particular piece of equipment, a particular mode of operation of a piece of equipment, or a particular use of a piece of equipment by a user.

Although the process illustrated in FIG. 7 is directed to classifying an optically detected power disturbance, it should be appreciated that the process could be used to classify other types of time varying signals, such as vibrational data. Further, the methodology may be used to learn features of new classes of power disturbances, in addition to features of known classes of power disturbances.

It should further be appreciated that, although the steps shown in FIG. 7 are described in terms of classifying an individual optically detected power quality disturbance, the system and methodology described herein could be used to analyze and classify multiple optically detected simultaneous power quality disturbances.

FIG. 8 is a block diagram of a computing device with which a signal processing and classification system may be implemented, according to illustrative embodiments. Although no connections are shown between the components illustrated in FIG. 8, those skilled in the art will appreciate that the components can interact with each other via any suitable connections to carry out device functions.

The term "application", or variants thereof, is used expansively herein to include routines, program modules, program, components, data structures, algorithms, and the like. Applications can be implemented on various system configurations, including single-processor or multiprocessor systems, minicomputers, mainframe computers, personal computers, handheld-computing devices, microprocessor-based, programmable consumer electronics, combinations thereof, and the like. The terminology "computer-readable media" and variants thereof, as used in the specification and claims, includes non-transitory storage media. Storage media can include volatile and/or non-volatile, removable and/or non-removable media, such as, for example, RAM, ROM, EEPROM, flash memory or other memory technology, CDROM, DVD, or other optical disk storage, magnetic tape, magnetic disk storage, or other magnetic storage devices or any other medium that can be used to store information that can be accessed.

Referring to FIG. 8, the computing device 800 may be implemented in any suitable computing device, e.g., a consumer laptop. The computing device 800 includes a processor 810 that receives inputs and transmits outputs via I/O Data Ports 820. The I/O Data Ports 820 can be implemented with, e.g., any suitable interface through which data and signals may be received and transmitted wired and/or wirelessly. For example, the inputs may include recorded video of a light source affected by a power quality disturbance, and the outputs may include data indicating a class to which an optically detected power quality disturbance belongs.

Although not shown, the computing device 800 may also include a physical hard drive. The processor 810 communicates with the memory 830 and the hard drive via, e.g., an address/data bus (not shown). The processor 810 can be any commercially available or custom microprocessor. The memory 830 is representative of the overall hierarchy of memory devices containing the software and data used to implement the functionality of the computing device 800. The memory 830 can include, but is not limited to the types of memory devices described above. As shown in FIG. 8, the memory 830 may include several categories of software and data used in the computing device 800, including applications 840, a database 850, an operating system (OS) 860, etc.

The applications 840 can be stored in the memory 830 and/or in a firmware (not shown) as executable instructions, and can be executed by the processor 810. The applications 840 include various programs that implement the various features of the computing device 800. For example, the applications 840 may include applications to implement the functions of the signal processing and classifying unit (including, for example, converting recorded video to digital data, extracting intensity responses and frequency responses, learning features of known classes of power quality disturbances, filtering, and performing cross-covariance).

The database 850 represents the static and dynamic data used by the applications 840, the OS 860, and other software programs that may reside in the memory. The database may 850 may be used to store various data including data needed to execute the applications 840, e.g., data indicative of features of known classes of power quality disturbances, including intensity responses and frequency responses associated with known classes of power quality disturbances.

While the memory 830 is illustrated as residing proximate the processor 810, it should be understood that at least a portion of the memory 830 can be a remotely accessed storage system, for example, a server on a communication network, a remote hard disk drive, a removable storage medium, combinations thereof, and the like.

It should be understood that FIG. 8 and description above are intended to provide a brief, general description of a suitable environment in which the various aspects of some embodiments of the present disclosure can be implemented. While the description includes a general context of computer-executable instructions, the present disclosure can also be implemented in combination with other program modules and/or as a combination of hardware and software in addition to, or instead of, computer readable instructions. For example, the signal processing and classification system could be implemented in whole or in part on specialized hardware, for example in a field-programmable gate array in order to achieve faster computation times.

The system and methods described herein offer a full spectrum from optical detection of power quality disturbances to machine learning classification of power quality disturbances using non-invasive means. Power quality disturbances may be classified as being caused by a particular load or a mode of operation of a load. Based on this classification, utilization of various loads may be tracked which is expected to have useful applications in the Internet of Things (IoT).

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method for classifying an optically detected power quality disturbance, comprising:
   a) learning features associated with different power quality disturbances that belong to a plurality of different known classes of power quality disturbances;
   b) applying cross-covariance to the optically detected power quality disturbance and the different power quality disturbances that belong to the plurality of different known classes of power quality disturbances to recognize features of the optically detected power quality disturbance that at least partially match the learned features associated with the different power quality disturbances, wherein the optically detected power quality disturbance is detected remotely from a load causing the optically detected power quality disturbance; and
   c) determining a class of power quality disturbances among the plurality of classes of different known power quality disturbances to which the optically detected power quality disturbance belongs based on the recognized features.

2. The method of claim 1, wherein the learned features associated with the power quality disturbances that belong to the plurality of different known classes of power quality disturbances include features of at least one of the group of features consisting of intensity responses and frequency responses.

3. The method of claim 2, wherein step b) further comprises determining at least one of an intensity response and a frequency response of the optically detected power quality disturbance and mapping the at least one of the intensity response and the frequency response of the optically detected power quality disturbance to a corresponding at least one of the intensity responses and frequency responses of the power quality disturbances that belong to the plurality of different known classes of power quality disturbances.

4. The method of claim 3, wherein mapping includes recognizing features of at least one of the intensity response and the frequency response of the optically detected power quality disturbance that at least partially match features of at least one of the intensity response and the frequency response of a power quality disturbance belonging to a known class.

5. The method of claim 1, wherein step b) includes recognizing features of a plurality of simultaneous optically detected power quality disturbances that at least partially match the learned features associated with the power quality disturbances that belong to the plurality of different known classes of power quality disturbances.

6. The method of claim 5, wherein step c) includes determining the class of power quality disturbances among the plurality of classes of power quality disturbances to which each of the simultaneous optically detected power quality disturbances belongs based on the recognized features.

7. The method of claim 1, wherein the plurality of different known classes of power quality disturbances correspond to at least one of power quality disturbances caused by different respective loads and power quality disturbances caused by different modes of operation of a same load.

8. A device for classifying an optically detected power quality disturbance caused by a remote load, comprising:
   a processor; and
   a memory having stored thereon instructions which, when executed by the processor, cause the processor to perform steps comprising:
   a) learning features associated with different power quality disturbances that belong to a plurality of different known classes of power quality disturbances, wherein the plurality of different known classes of power quality disturbances correspond to at least one of power quality disturbances caused by different respective loads and power quality disturbances caused by different modes of operation of a same load;
   b) applying cross-covariance to the optically detected power quality disturbance and the power quality disturbances that belong to the different known classes of power quality disturbances to recognize features of the optically detected power quality disturbance that at least partially match the learned features associated with the different power quality disturbances, wherein the optically detected power quality disturbance is detected remotely from a load causing the optically detected power quality disturbance; and
   c) determining a class of power quality disturbances among the plurality of different known classes of power quality disturbances to which the optically detected power quality disturbance belongs based on the recognized features.

9. The device of claim 8, wherein the learned features associated with the power quality disturbances that belong to the different known classes of power quality disturbances include features of at least one of the group of features consisting of intensity responses and frequency responses.

10. The device of claim 9, wherein step b) further comprises determining at least one of an intensity response and a frequency response produced by the optically detected power quality disturbance and mapping the at least one of the intensity response and the frequency response produced of the optically detected power quality disturbance to a corresponding at least one of the intensity responses and frequency responses produced by the different power quality disturbances that belong to the different known classes of power quality disturbances.

11. The device of claim 10, wherein mapping includes recognizing features of at least one of the intensity response and the frequency response of the optically detected power quality disturbance that at least partially match features of at least one of the intensity response and the frequency response of a power quality disturbance belonging to a known class.

12. The device of claim 8, wherein step b) includes recognizing features of a plurality of simultaneous optically detected power quality disturbances that at least partially match the learned features associated with the different power quality disturbances that belong to the plurality of different known classes.

13. The device of claim 12, wherein step c) includes determining the class of power quality disturbances among the plurality of classes of power quality disturbances to which each of the simultaneous optically detected power quality disturbances belongs based on the recognized features.

14. A method for classifying an optically detected power quality disturbance caused by a remote load, comprising:
  a) learning features associated with intensity responses and frequency responses of different power quality disturbances that belong to different known classes of power quality disturbances;
  b) determining at least one of an intensity response and a frequency response of the optically detected power quality disturbance caused by the remote load;
  c) recognizing features of at least one of the intensity response and the frequency response of the optically detected power quality disturbance that at least partially match the learned features associated with the intensity response and frequency responses of the different power quality disturbances that belong to the different known classes of power quality disturbances; and
  d) determining a class of power quality disturbances among the different known classes of power quality disturbances to which the optically detected power quality disturbance belongs based on the recognized features,
  wherein step b) comprises:
    analyzing a video of a light source recorded over time to isolate a pixel that is indicative of the power quality disturbance caused by the remote load; and
    extracting at least one of the group of features consisting of an intensity response and a frequency response from the video of the light source recorded over time.

15. The method of claim 14, wherein the intensity response corresponds to a variation in an intensity of the pixel as recorded over time.

16. The method of claim 14, wherein the frequency response is determined by applying a Fast Fourier transform to the intensity response.

17. The method of claim 14, wherein the light source includes at least one of a direct light source and an indirect light source.

18. The method of claim 17, wherein the indirect light source includes a reflective surface.

19. The method of claim 14, wherein the different known classes of power quality disturbances correspond to at least one of power quality disturbances caused by different loads and power quality disturbances caused by different modes of operation of the same load.

* * * * *